US012437972B2

(12) United States Patent
Hirayama

(10) Patent No.: US 12,437,972 B2
(45) Date of Patent: Oct. 7, 2025

(54) PLASMA PROCESSING APPARATUS

(71) Applicant: Tokyo Electron Limited, Tokyo (JP)

(72) Inventor: Masaki Hirayama, Fuchu (JP)

(73) Assignee: Tokyo Electron Limited, Tokyo (JP)

( * ) Notice: Subject to any disclaimer, the term of this patent is extended or adjusted under 35 U.S.C. 154(b) by 97 days.

(21) Appl. No.: 18/411,533

(22) Filed: Jan. 12, 2024

(65) Prior Publication Data

US 2024/0242937 A1 Jul. 18, 2024

(30) Foreign Application Priority Data

Jan. 18, 2023 (JP) ................................ 2023-005800

(51) Int. Cl.
*H01J 37/32* (2006.01)

(52) U.S. Cl.
CPC .. *H01J 37/32256* (2013.01); *H01J 37/32229* (2013.01); *H01J 2237/327* (2013.01)

(58) Field of Classification Search
None
See application file for complete search history.

(56) References Cited

U.S. PATENT DOCUMENTS 11,854,772 B2 12/2023 Hirayama
11,908,663 B2 * 2/2024 Ikeda .................. H01L 21/3065
11,923,170 B2 3/2024 Kawakami et al.
12,087,552 B2 9/2024 Hirayama
2002/0108933 A1 8/2002 Hoffman et al.
2003/0178143 A1 9/2003 Perrin
2009/0140828 A1 6/2009 Shannon et al.
2013/0292057 A1 11/2013 Ramaswamy et al.
2014/0225503 A1 8/2014 Mori et al.
2015/0075716 A1 3/2015 Ramaswamy et al.
2016/0276134 A1 9/2016 Collins et al.
2019/0180984 A1 * 6/2019 Ikeda .................. H01J 37/3244
2023/0010178 A1 1/2023 Hirayama
(Continued)

FOREIGN PATENT DOCUMENTS

JP H03-019332 A 1/1991
JP H08-236448 A 9/1996
(Continued)

*Primary Examiner* — Crystal L Hammond
(74) *Attorney, Agent, or Firm* — Armstrong Teasdale LLP

(57) ABSTRACT

A plasma processing apparatus includes: a chamber having a processing space therein; a substrate support provided inside the processing space; an upper electrode provided above the substrate support with the processing space interposed therebetween; an emitter provided to emit electromagnetic waves into a plasma generation space and extending in a circumferential direction around a central axis of the chamber and the processing space; and a waveguide configured to supply the electromagnetic waves to the emitter; wherein the waveguide includes a resonator having a waveguide path therein, wherein the resonator includes a first short-circuiting portion constituting a first end of the waveguide path and a second short-circuiting portion constituting a second end of the waveguide path, wherein the second end of the waveguide path is electromagnetically coupled to the emitter, and wherein the second short-circuiting portion has a capacitance that short-circuits the waveguide path at a frequency of the electromagnetic waves.

14 Claims, 4 Drawing Sheets

(56) References Cited

U.S. PATENT DOCUMENTS

| | | | |
|---|---|---|---|
| 2024/0071730 | A1 | 2/2024 | Hirayama |
| 2024/0242934 | A1 | 7/2024 | Hirayama |
| 2024/0242936 | A1 | 7/2024 | Hirayama |
| 2024/0242937 | A1 | 7/2024 | Hirayama |

FOREIGN PATENT DOCUMENTS

| | | | |
|---|---|---|---|
| JP | 2007-217738 | A | 8/2007 |
| JP | 2011-103238 | A | 5/2011 |
| JP | 2020-092031 | A | 6/2020 |

* cited by examiner

PLASMA PROCESSING APPARATUS

CROSS-REFERENCE TO RELATED APPLICATION

This application is based upon and claims the benefit of priority from Japanese Patent Application No. 2023-005800, filed on Jan. 18, 2023, the entire contents of which are incorporated herein by reference.

TECHNICAL FIELD

The present disclosure relates to a plasma processing apparatus.

BACKGROUND

A plasma processing apparatus is used in processing a substrate. A type of the plasma processing apparatus, in which a gas is excited using radio frequency waves such as VHF waves or UHF waves, is known. Patent Document 1 discloses the aforementioned plasma processing apparatus. The plasma processing apparatus disclosed in Patent Document 1 includes a process container, a stage, an upper electrode, an introducer, and a waveguide. The stage is provided in the process container. The upper electrode is provided above the stage with a space in the process container interposed therebetween. The introducer is a radio frequency wave introducer. The introducer is provided at a lateral end of the space and extends in a circumferential direction around a central axis of the process container. The waveguide is configured to supply radio frequency waves to the introducer. The waveguide includes a resonator that provides a waveguide path. The waveguide path of the resonator extends in the circumferential direction around the central axis and in an extension direction of the central axis, and is connected to the introducer.

PRIOR ART DOCUMENT

Patent Document

Patent Document 1: Japanese Patent Laid-Open Publication No. 2020-092031

SUMMARY

One embodiment of the present disclosure provides a plasma processing apparatus. The plasma processing apparatus includes a chamber, a substrate support, an upper electrode, an emitter, and a waveguide. The chamber provides a processing space in the chamber. The substrate support is provided inside the processing space. The upper electrode is provided above the substrate support with the processing space interposed between the upper electrode and the substrate support. The emitter is provided to emit electromagnetic waves into a plasma generation space and extends in a circumferential direction around a central axis of the chamber and the processing space. The waveguide is configured to supply the electromagnetic waves to the emitter. The waveguide includes a resonator configured to provide a waveguide path. The resonator includes a first short-circuiting portion constituting a first end of the waveguide path of the resonator and a second short-circuiting portion constituting a second end of the waveguide path of the resonator. The second end of the waveguide path of the resonator is electromagnetically coupled to the emitter. The second short-circuiting portion has a capacitance that short-circuits the waveguide path at a frequency of the electromagnetic waves.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
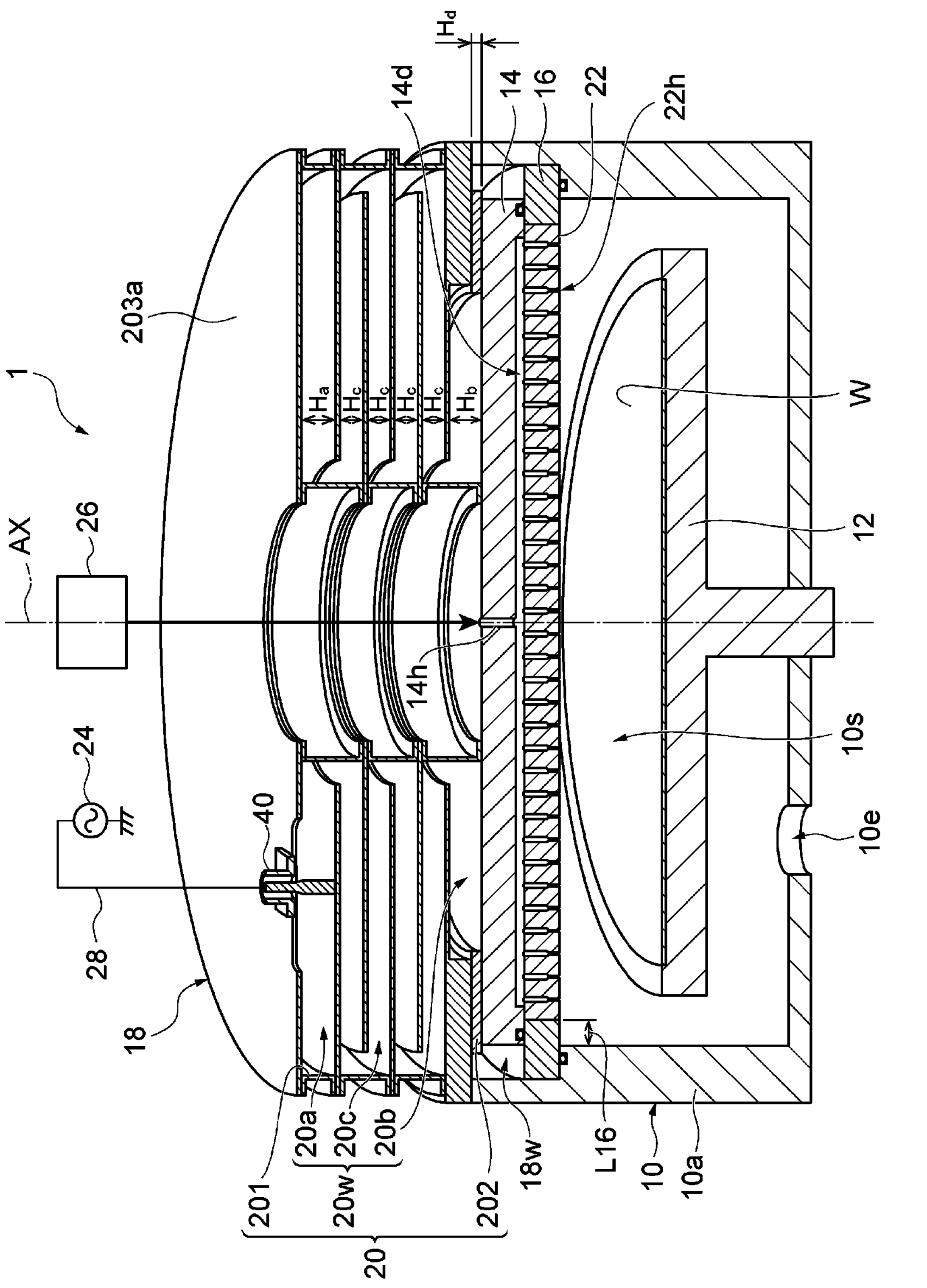
FIG. 1 is a view showing a plasma processing apparatus according to one exemplary embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Various exemplary embodiments will be described below in detail with reference to the drawings. In addition, the same or corresponding parts are designated by like reference numerals throughout the drawings.

FIG. 1 is a view showing a plasma processing apparatus according to one exemplary embodiment. A plasma processing apparatus 1 shown in FIG. 1 includes a chamber 10, a substrate support 12, an upper electrode 14, an emitter 16, and a waveguide 18.

The chamber 10 provides a processing space **10*s* therein. The processing space 10*s* includes a plasma generation space. In the plasma processing apparatus 1, a substrate W is processed in the processing space 10*s*. The chamber 10 is made of metal such as aluminum or the like and is grounded. The chamber 10 has a side wall 10*a*, and is open at an upper end thereof. The chamber 10 and the side wall 10*a* may have a substantially cylindrical shape. The processing space 10*s* is provided inward of the side wall 10*a*. A central axis of each of the chamber 10, the side wall 10*a*, and the processing space 10*s* is an axis AX. The chamber 10** may have a corrosion-resistant film on a surface thereof. The corrosion-resistant film may be an yttrium oxide film, an yttrium oxide fluoride film, an yttrium fluoride film, or a ceramic film that includes yttrium oxide, yttrium fluoride, or the like.

A bottom of the chamber 10 provides an exhaust port **10*e*. An exhaust device is connected to the exhaust port 10*e***. The exhaust device may include a vacuum pump, such as a dry pump and/or a turbomolecular pump, and an automatic pressure control valve.

The substrate support 12 is provided in the processing space **10*s*. The substrate support 12 is configured to substantially horizontally support the substrate W placed on an upper surface thereof. The substrate support 12 has a substantially disk-like shape. A central axis of the substrate support 12** is the axis AX.

The upper electrode 14 is provided above the substrate support 12 with the processing space 10*s* interposed therebetween. The upper electrode 14 is made of a conductor such as metal (for example, aluminum) and has a substantially disk-like shape. A central axis of the upper electrode 14 is the axis AX.

The emitter 16 is provided to emit electromagnetic waves therefrom into the processing space 10*s*. In the plasma processing apparatus 1, a gas existing in the processing space 10*s* is excited by the electromagnetic waves emitted from the emitter 16 into the processing space 10*s*, thereby generating plasma. The electromagnetic waves emitted from the emitter 16 into the processing space 10*s* may be radio frequency waves such as VHF waves or UHF waves. The emitter 16 is made of a dielectric material such as quartz, aluminum nitride, or aluminum oxide. The emitter 16 is provided at a lateral end of the processing space 10*s* and extends in the circumferential direction around the axis AX. The emitter 16 may have an annular shape.

The waveguide 18 is configured to supply electromagnetic waves to the emitter 16. The electromagnetic waves are generated by a radio-frequency power supply 24, which will be described later. The electromagnetic waves propagate to the emitter 16 via the waveguide 18, and are introduced from the emitter 16 into the processing space 10*s*. The waveguide 18 includes a resonator 20. Details of the resonator 20 will be described later.

In one embodiment, the plasma processing apparatus 1 may further include a shower plate 22. The shower plate 22 may be made of metal such as aluminum. The emitter 16 extends to surround the shower plate 22. The emitter 16 and the shower plate 22 are disposed to close the opening at the upper end of the chamber 10. The shower plate 22 provides a plurality of gas holes 22*h*. The gas holes 22*h* extend in a thickness direction (vertical direction) of the shower plate 22 and penetrate the shower plate 22.

The shower plate 22 is provided below the upper electrode 14. The shower plate 22 and the upper electrode 14 define a gas diffusion space 14*d* therebetween. A central axis of the gas diffusion space 14*d* may be the axis AX. The gas holes 22*h* of the shower plate 22 are connected to the gas diffusion space 14*d*. The upper electrode 14 also provides an inlet 14*h*. The inlet 14*h* may extend along the axis AX. The inlet 14*h* is connected to the gas diffusion space 14*d*. A gas supply 26 is connected to the gas diffusion space 14*d*. A gas output from the gas supply 26 is supplied to the processing space 10*s* via the inlet 14*h*, the gas diffusion space 14*d*, and the gas holes 22*h*.

The plasma processing apparatus 1 may further include the radio-frequency power supply 24. The radio-frequency power supply 24 is electrically coupled to a waveguide path of the resonator 20 and is configured to generate radio-frequency power having a variable frequency. The electromagnetic waves to be introduced into the chamber 10 are generated based on the radio-frequency power generated by the radio-frequency power supply 24. The radio-frequency power supply 24 may be directly connected to the waveguide path of the resonator 20 by using a coaxial line 28. That is, the radio-frequency power supply 24 may be coupled to a waveguide path 20*w* of the resonator 20 without using a matching device for impedance matching.

The resonator 20 provides the waveguide path 20*w*. The waveguide path 20*w* may provide a cavity surrounded by a wall made of a conductor such as metal (hereinafter referred to as a "conductor wall"). The conductor wall of the waveguide path 20*w* may be made of aluminum alloy, copper, nickel, stainless steel, or the like, and may be coated with a low-resistance material such as silver, gold, or rhodium.

The resonator 20 includes a first short-circuiting portion 201 and a second short-circuiting portion 202. The first short-circuiting portion 201 constitutes a first end of the waveguide path 20*w* of the resonator 20. In one embodiment, the first short-circuiting portion 201 may extend in the circumferential direction around the axis AX.

The second short-circuiting portion 202 constitutes a second end of the waveguide path 20*w* of the resonator 20. The second end of the waveguide path 20*w* of the resonator 20 is electromagnetically coupled to the emitter 16. In the example shown in FIG. 1, the other end of the waveguide path 20*w* of the resonator 20 is connected to the emitter 16 via a waveguide path 18*w* of the waveguide 18. The waveguide path 18*w* may be provided between the upper electrode 14 and the side wall 10*a* of the chamber 10, and may extend around the axis AX. The waveguide path 18*w* may be filled with a dielectric material.

The second short-circuiting portion 202 has a capacitance that short-circuits the waveguide path 20*w* at a frequency of electromagnetic waves such that the electromagnetic waves are caused to resonate between the first short-circuiting portion 201 and the second short-circuiting portion 202. In one embodiment, the second short-circuiting portion 202 may be provided along the circumferential direction around the axis AX.

A resonance length L of the resonator 20 between the first short-circuiting portion 201 and the second short-circuiting portion 202 (a distance of connection between the first short-circuiting portion 201 and the second short-circuiting portion 202 along the waveguide path 20*w*) may satisfy the following Equation (1).

$$n\lambda_g/2 < L < (n+0.2)\lambda_g/2 \qquad \text{Equation (1)}$$

In Equation (1), $\lambda_g$ is a wavelength of electromagnetic waves in the waveguide path 20*w*. In addition, n is an integer. Since the second short-circuiting portion 202 has a capacitive reactance, the resonance length L may be set to a value slightly larger than $n\lambda_g/2$, as represented by Equation (1).

In one embodiment, the waveguide path 20*w* of the resonator 20 may have a layered structure including an upper portion 20*a* and a lower portion 20*b*. The lower portion 20*b* is disposed around the axis AX and extends in a radial direction (radially outward direction) with respect to the axis AX toward the second short-circuiting portion 202, which is the second end. The upper portion 20*a* is disposed around the axis AX and above the lower portion 20*b*, and extends from the first short-circuiting portion 201 in an opposite direction (radially inward direction) to the radial direction. That is, the upper portion 20*a* extends from the first short-circuiting portion 201 toward the axis AX. The waveguide path 20*w* is disposed around the axis AX and extends alternately in the radial direction and the opposite direction (radially outward and inward directions) in a meandering manner from the first short-circuiting portion 201 to the second short-circuiting portion 202.

In one embodiment, the waveguide path 20*w* may further include an intermediate portion 20*c*. The intermediate portion 20*c* is provided between the upper portion 20*a* and the lower portion 20*b*. That is, the intermediate portion 20*c* is provided below the upper portion 20*a* and above the lower portion 20*b*. A first end of the intermediate portion 20*c* is connected to an inner end of the upper portion 20*a*, i.e., an end of the upper portion 20*a* on an inner side with respect to the first short-circuiting portion 201. A second end of the intermediate portion 20*c* is connected to an inner end of the lower portion 20*b*, i.e., an end of the lower portion 20*b* on an inner side with respect to the second short-circuiting portion 202. The intermediate portion 20*c* may be disposed around the axis AX and extend alternately in the radial direction and in the opposite direction (radially outward and inward directions) in a meandering manner.

In one embodiment, the second short-circuiting portion 202 is made of a dielectric material, and may be an annular plate interposed between an upper conductor wall and a lower conductor wall (the upper electrode 14 in the example of FIG. 1) that constitute the lower portion 20*b*. In order to cause the electromagnetic waves to resonate between the first short-circuiting portion 201 and the second short-circuiting portion 202, the second short-circuiting portion 202 has an impedance lower than a characteristic impedance of the waveguide path 20*w* in the lower portion 20*b* with respect to the electromagnetic waves. Accordingly, the second short-circuiting portion 202 has a large capacitance. Therefore, a thickness Hd of the annular plate constituting the second short-circuiting portion 202 is smaller than a length Hb of the lower portion 20*b* (or a height of the lower portion 20*b*) in a vertical direction along which the axis AX extends. In addition, the length Hb is a length in the vertical direction of the waveguide path 20*w* in the lower portion 20*b*, and is a distance in the vertical direction between the pair of conductor walls (the upper conductor wall and the lower conductor wall) that constitute the lower portion 20*b*.

In one embodiment, the thickness Hd and the length Hb may satisfy the following Equation (2) or Equation (3).

$$\frac{H_b\sqrt{\varepsilon_r}}{H_d} > 9 \quad \text{Equation (2)}$$

$$\frac{H_b\sqrt{\varepsilon_r}}{H_d} > 19 \quad \text{Equation (3)}$$

Here, $\varepsilon_r$ is a relative dielectric constant of the dielectric material that constitutes the second short-circuiting portion 202.

In the resonator 20, the electromagnetic waves are supplied to the emitter 16 from the second end of the waveguide path 20*w* of the resonator 20, and are caused to resonate between the first short-circuiting portion 201 and the second short-circuiting portion 202. Therefore, an absolute value of a reflection coefficient Γ of the second short-circuiting portion 202 has a large value, which is smaller than 1 and close to 1. Assuming no reflection is generated from below the first short-circuiting portion 201, the reflection coefficient Γ is approximately expressed by the following Equation (4). When the absolute value of the reflection coefficient Γ is smaller than 1 and larger than 0.8, Equation (2) is derived from Equation (4). When the absolute value of the reflection coefficient Γ is smaller than 1 and larger than 0.9, Equation (3) is derived from Equation (4).

$$\Gamma = \frac{\frac{H_d}{H_b\sqrt{\varepsilon_r}} - 1}{\frac{H_d}{H_b\sqrt{\varepsilon_r}} + 1} \quad \text{Equation (4)}$$

In one embodiment, the length Hb may be larger than a length Hc of the intermediate portion 20*c* (or a height of the intermediate portion 20*c*) in the vertical direction. The length Hc is a length of the intermediate portion 20*c* in the vertical direction of the waveguide path 20*w*, and is a distance in the vertical direction between a pair of conductor walls (an upper conductor wall and a lower conductor wall) that constitute the waveguide path 20*w* in the intermediate portion 20*c*. In this embodiment, even when the thickness Hd is large, the thickness Hd can be made relatively small with respect to the length Hb. Therefore, a thickness of the annular plate constituting the second short-circuiting portion 202 can be secured while setting an impedance of the second short-circuiting portion 202 to be lower than an impedance of the waveguide path 20*w* in the lower portion 20*b*.

In one embodiment, a radial length L16 of a region in the emitter 16 exposed to the processing space 10*s* may be larger than the thickness Hd. In this case, it is possible to reduce a change in resonance frequency of the electromagnetic waves before and after plasma ignition.

In one embodiment, the plasma processing apparatus 1 may further include a connector 40 configured to introduce the electromagnetic waves into the waveguide path 20*w*. The connector 40 is a part of the coaxial line 28. The radio-frequency power supply 24 is coupled to the upper portion 20*a* via the coaxial line 28 and the connector 40. The connector 40 may be coupled to the upper portion 20*a* at a location spaced apart radially from the axis AX. Details of the connector 40 will be described later.

The length Ha of the upper portion 20*a* (or the height of the upper portion 20*a*) in the extension direction of the axis AX, i.e., in the vertical direction, may be larger than the lengths of the other portions of the waveguide path 20*w* in the vertical direction. In the example shown in FIG. 1, the length Ha is larger than the length Hb and the length Hc. The length Ha is the distance in the vertical direction between the pair of conductor walls (the upper conductor wall and the lower conductor wall) of the upper portion 20*a*. A reactance of the upper portion 20*a* is changed according to the length Ha of the upper portion 20*a*. Therefore, it is possible to adjust the resonance length L according to the length Ha of the upper portion 20*a*.

Figure 2:
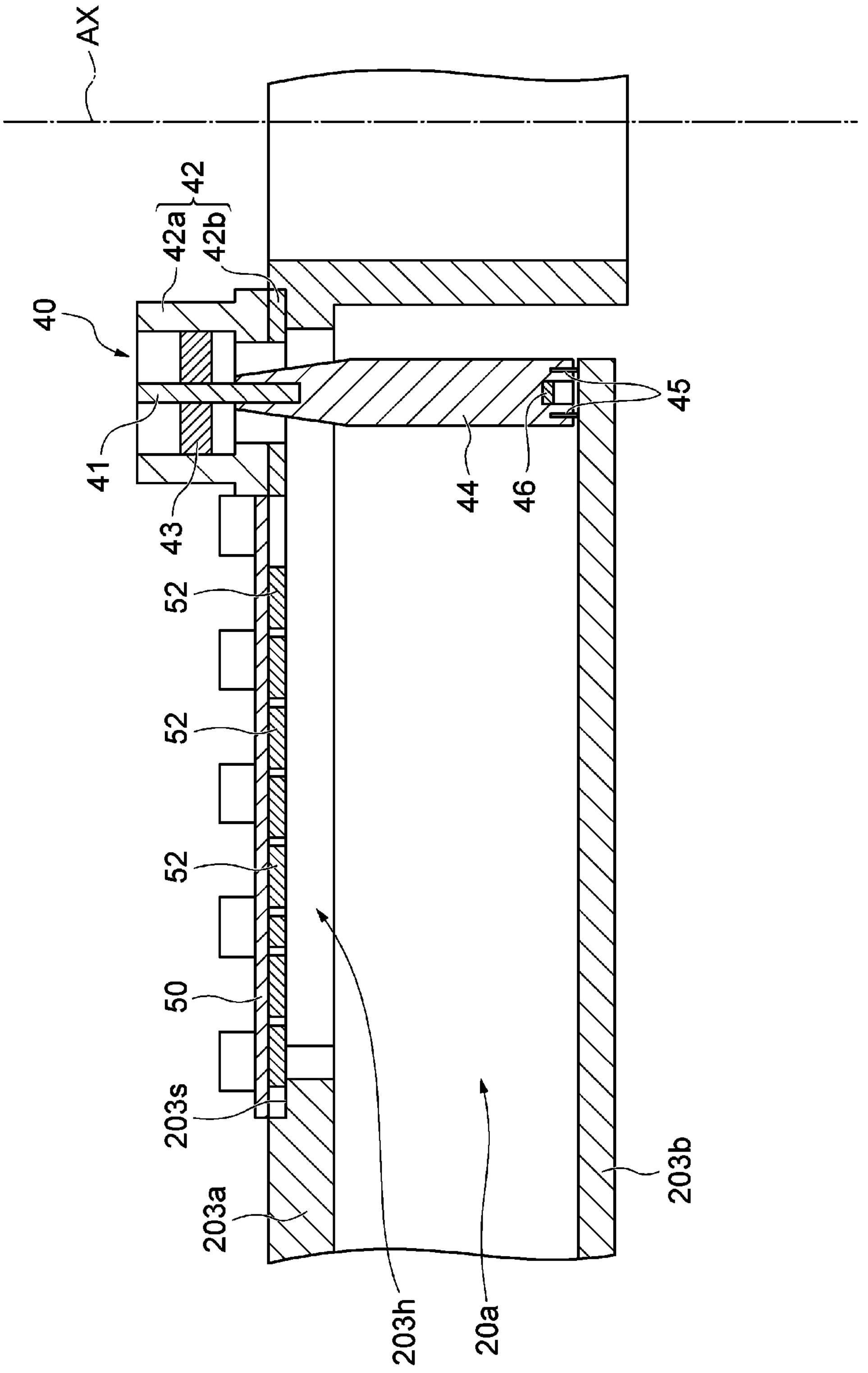
FIG. 2 is a partially enlarged cross-sectional view showing a resonator and a connector of the plasma processing apparatus according to one exemplary embodiment.
Figure 3:
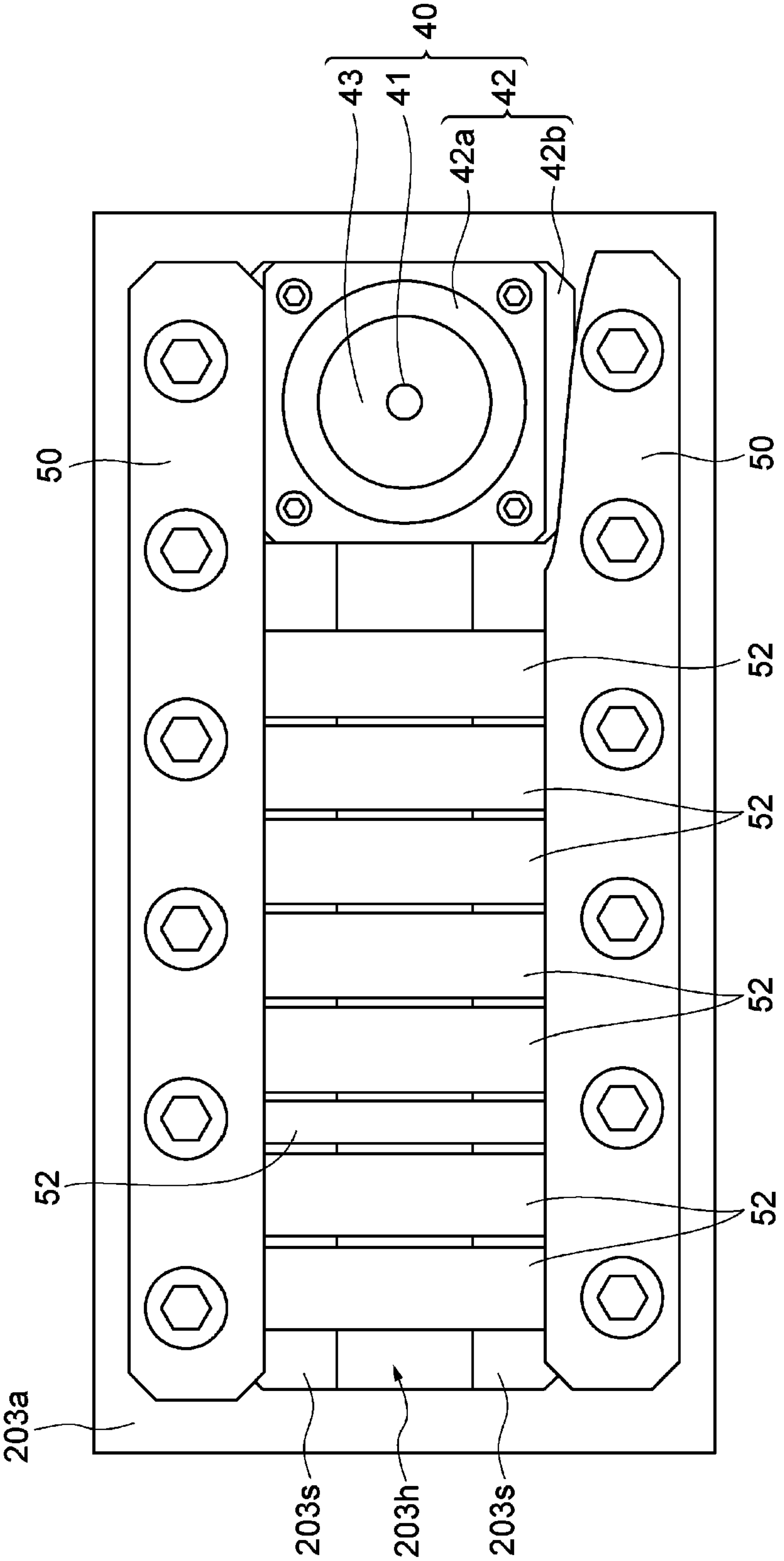
FIG. 3 is a partially enlarged plan view showing the resonator and the connector of the plasma processing apparatus according to one exemplary embodiment.

Hereinafter, an example of a structure of the connector 40 will be described with reference to FIGS. 2 and 3 together with FIG. 1. FIG. 2 is a partially enlarged cross-sectional view of the resonator and the connector of the plasma processing apparatus according to one exemplary embodiment. FIG. 3 is a partially enlarged plan view showing the resonator and the connector of the plasma processing apparatus according to one exemplary embodiment. FIG. 3 shows a state in which one side of a pair of pressers is partially cut out.

The connector 40 is coupled to the waveguide path 20*w* at the upper portion 20*a*, as described above. The connector 40 may be configured to be movable radially with respect to the axis AX. In this case, a location where the connector 40 is coupled to the resonator 20 can be adjusted to a location where reflection of the electromagnetic waves can be suppressed (for example, a location where no reflection is generated).

In one embodiment, the connector 40 may be a coaxial connector. In this case, the connector 40 may include a center conductor 41, an outer conductor 42, a spacer 43, a coupling rod 44, and one or more contactors 45.

The center conductor 41 has a rod shape. The center conductor 41 is electrically connected to the radio-frequency power supply 24. The outer conductor 42 has a cylindrical shape. The center conductor 41 is provided coaxially with the outer conductor 42. The spacer 43 is made of an insulator such as polytetrafluoroethylene or the like. The spacer 43 is interposed between the center conductor 41 and the outer conductor 42.

A through-hole 203*h* connected to a cavity of the upper portion 20*a* is formed in an upper conductor wall 203*a* of the upper portion 20*a*. The through-hole 203*h* is lengthened radially with respect to the axis AX. The upper conductor wall 203*a* provides support surfaces 203*s* on both sides of the through-hole 203*h*. The support surfaces 203*s* face upward.

The coupling rod 44 is coupled to a lower end of the center conductor 41. The coupling rod 44 extends downward via the through-hole 203*h*. The one or more contactors 45 are provided at a lower end of the coupling rod 44. The one or more contactors 45 may be resiliently in contact with a lower conductor wall 203*b* of the upper portion 20*a*. In one embodiment, the connector 40 may include a magnet 46 embedded in the coupling rod 44 to prevent the one or more contactors 45 from falling off from the coupling rod 44.

In one embodiment, the connector 40 may include a plurality of contact probes as the one or more contactors 45. Each of the contact probes includes a barrel, a spring disposed in an inner bore of the barrel, and a plunger extending downward from the inner bore of the barrel and biased downward by the spring. The contact probes may be arranged in a circumferential direction around a central axis of the coupling rod 44. Alternatively, the connector 40 may include a spiral spring gasket or an obliquely-wound coil spring as the one or more contactors 45.

The outer conductor 42 is in contact with the support surface 203*s*. The outer conductor 42 is movable radially on the support surface 203*s*. Therefore, a coupling position of the connector 40 to the upper portion 20*a* in a radial direction can be adjusted to suppress reflection of the radio-frequency power.

In a state in which the position of the connector 40 in the radial direction is set, the outer conductor 42 may be held between the support surface 203*s* and each of the pair of pressers 50. Each of the pair of pressers 50 has, for example, a plate shape. The pair of pressers 50 are fixed to the upper conductor wall 203*a* by a plurality of bolts. In addition, one or more covers 52 may be disposed to cover the through-hole 203*h* or may be held between the support surface 203*s* and each of the pair of pressers 50 so that leakage of the electromagnetic waves from the through-hole 203*h* can be prevented.

In one embodiment, the outer conductor 42 may include a first member 42*a* and a second member 42*b*. The first member 42*a* is provided on the second member 42*b* and is fixed to the second member 42*b*. The first member 42*a* has a cylindrical shape. The spacer 43 is provided between the first member 42*a* and the center conductor 41. The second member 42*b* has a plate shape and provides a through-hole that is continuous with an inner hole of the first member 42*a*. The second member 42*b* is held between the support surface 203*s* and each of the pair of pressers 50.

In the plasma processing apparatus 1 described above, the resonance of the electromagnetic waves is promoted between the first short-circuiting portion 201 and the second short-circuiting portion 202. In addition, by the first short-circuiting portion 201 and the second short-circuiting portion 202, uniform resonance of the electromagnetic waves in the circumferential direction is promoted. The resonant electromagnetic waves are emitted from the emitter 16 into the processing space 10*s* via the second end of the resonator 20 (or the second short-circuiting portion 202). Therefore, according to the plasma processing apparatus 1, plasma is efficiently generated by the electromagnetic waves resonated between the first short-circuiting portion 201 and the second short-circuiting portion 202.

Figure 4:
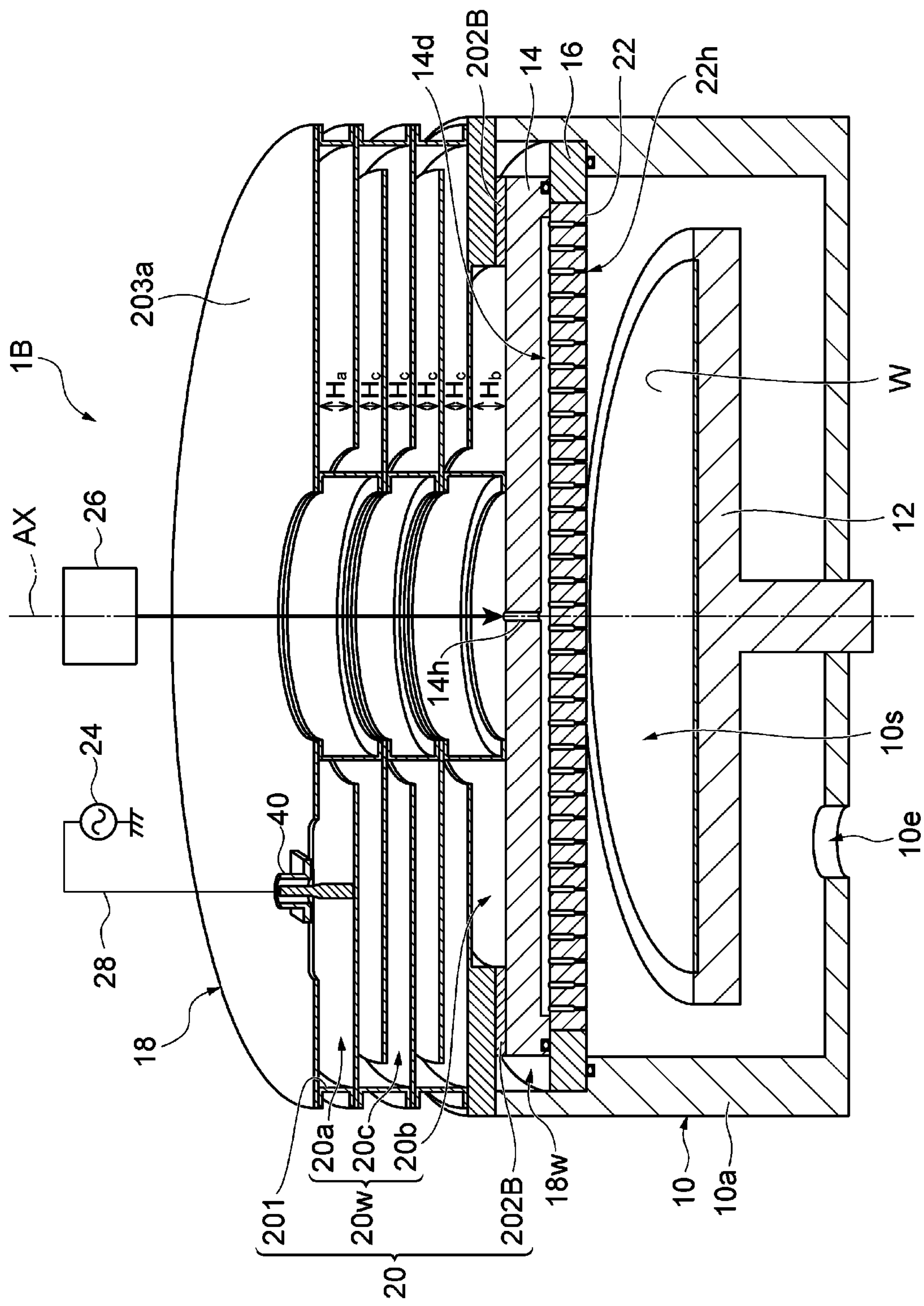
FIG. 4 is a view showing a plasma processing apparatus according to another exemplary embodiment.

Hereinafter, a plasma processing apparatus according to another exemplary embodiment will be described with reference to FIG. 4. FIG. 4 is a view illustrating a plasma processing apparatus according to another exemplary embodiment. A plasma processing apparatus 1B shown in FIG. 4 will be described below from the viewpoint of differences from the plasma processing apparatus 1.

In the plasma processing apparatus 1B, the resonator 20 includes a second short-circuiting portion 202B instead of the second short-circuiting portion 202. The second short-circuiting portion 202B is configured by a plurality of capacitor elements. One of a pair of electrodes of each of the capacitor elements is connected to the upper conductor wall forming the lower portion 20*b*. The other of the pair of electrodes of each of the capacitor elements is connected to the lower conductor wall (the upper electrode 14 in the example of FIG. 4) forming the lower portion 20*b*. The capacitor elements are arranged along the circumferential direction around the axis AX. The capacitor elements may be arranged at equal intervals along the circumferential direction. In the plasma processing apparatus 1B, the capacitor elements constitute the second short-circuiting portion 202B having an impedance lower than an impedance of the lower portion 20*b*.

Although various exemplary embodiments have been described above, various additions, omissions, substitutions, and changes may be made without being limited to the exemplary embodiments described above. In addition, elements of different embodiments may be combined to form other embodiments.

Various exemplary embodiments included in the present disclosure are recited in [E1] to [E13] below.

[E1]

A plasma processing apparatus, comprising:

a chamber configured to provide a processing space in the chamber;

a substrate support provided inside the processing space;

an upper electrode provided above the substrate support with the processing space interposed between the upper electrode and the substrate support part;

an emitter provided to emit electromagnetic waves into a plasma generation space and extending in a circumferential direction around a central axis of the chamber and the processing space; and a waveguide configured to supply the electromagnetic waves to the emitter;

wherein the waveguide includes a resonator configured to provide a waveguide path, wherein the resonator includes a first short-circuiting portion constituting a first end of the waveguide path of the resonator and a second short-circuiting portion constituting a second end of the waveguide path of the resonator, wherein the second end of the waveguide path of the resonator is electromagnetically coupled to the emitter, and wherein the second short-circuiting portion has a capacitance that short-circuits the waveguide path at a frequency of the electromagnetic waves.

[E2]

The plasma processing apparatus of E1, wherein a resonance length L of the resonator between the first short-circuiting portion and the second short-circuiting portion satisfies Equation (1):

$$n\lambda_g/2 < L < (n+0.2)\lambda_g/2, \quad \text{Equation (1)}$$

where $\lambda_g$ is a wavelength of the electromagnetic waves in the waveguide path of the resonator, and n is an integer.

[E3]

The plasma processing apparatus of E1 or E2, wherein each of the first short-circuiting portion and the second short-circuiting portion is provided along the circumferential direction around the central axis, wherein the waveguide path of the resonator includes:

a lower portion disposed around the central axis and extending in a radial direction with respect to the central axis toward the second short-circuiting portion; and an upper portion disposed above the lower portion and around the central axis, and extending from the first short-circuiting portion in an opposite direction to the radial direction, and wherein the waveguide path of the resonator is disposed around the central axis, and extends alternately in the radial direction and the opposite direction in a meandering manner from the first short-circuiting portion to the second short-circuiting portion.

[E4]

The plasma processing apparatus of E3, wherein the second short-circuiting portion is made of a dielectric material and includes an annular plate interposed between an upper conductor wall and a lower conductor wall that constitute the lower portion, and wherein a thickness Hd of the annular plate is smaller than a length Hb of the lower portion of the waveguide path in a vertical direction along which the central axis extends.

[E5]

The plasma processing apparatus of E4, wherein the waveguide path of the resonator includes an intermediate portion provided between the upper portion and the lower portion, and the length Hb of the lower portion in the vertical direction is larger than a length Hc of the intermediate portion in the vertical direction.

[E6]

The plasma processing apparatus of E4 or E5, wherein the thickness Hd and the length Hb satisfy Equation (2):

$$\frac{H_b\sqrt{\varepsilon_r}}{H_d} > 9, \quad \text{Equation (2)}$$

where $\varepsilon_r$ is a relative dielectric constant of the dielectric material.

[E7]

The plasma processing apparatus of E4 or E5, wherein the thickness Hd and the length Hb satisfy Equation (3):

$$\frac{H_b\sqrt{\varepsilon_r}}{H_d} > 19, \quad \text{Equation (3)}$$

where $\varepsilon_r$ is a relative dielectric constant of the dielectric material.

[E8]

The plasma processing apparatus of any one of E4 to E7, wherein a length in the radial direction of a region in the emitter exposed to the processing space is larger than the thickness Hd.

[E9]

The plasma processing apparatus of any one of E3 to E8, further comprising:

a connector configured to introduce the electromagnetic waves into the waveguide path of the resonator, wherein the connector is coupled to the upper portion.

[E10]

The plasma processing apparatus of E9, wherein a length of the upper portion in the vertical direction along which the central axis extends is larger than the length of the lower portion and the length of the intermediate portion in the vertical direction.

[E11]

The plasma processing apparatus of E9 or E10, wherein the connector is coupled to the upper portion at a location spaced apart from the central axis in the radial direction.

[E12]

The plasma processing apparatus of any one of E1 to E11, further comprising:

a shower plate disposed below the upper electrode, wherein the emitter extends to surround the shower plate.

[E13]

The plasma processing apparatus of any one of E1 to E12, further comprising:

a radio-frequency power supply electrically coupled to the waveguide path of the resonator, and configured to generate radio-frequency power having a variable frequency and supply the electromagnetic waves into the waveguide path.

According to the present disclosure in some embodiments, it is possible to promote resonance of electromagnetic waves in a resonator of a plasma processing apparatus.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A plasma processing apparatus, comprising:

a chamber configured to provide a processing space in the chamber;

a substrate support provided inside the processing space;

an upper electrode provided above the substrate support with the processing space interposed between the upper electrode and the substrate support;

an emitter provided to emit electromagnetic waves into a plasma generation space and extending in a circumferential direction around a central axis of the chamber and the processing space; and a waveguide configured to supply the electromagnetic waves to the emitter, wherein the waveguide includes a resonator configured to provide a waveguide path, wherein the resonator includes a first short-circuiting portion constituting a first end of the waveguide path of the resonator and a second short-circuiting portion constituting a second end of the waveguide path of the resonator, wherein the second end of the waveguide path of the resonator is electromagnetically coupled to the emitter, and wherein the second short-circuiting portion has a capacitance that short-circuits the waveguide path at a frequency of the electromagnetic waves.

2. The plasma processing apparatus of claim 1, wherein a resonance length L of the resonator between the first short-circuiting portion and the second short-circuiting portion satisfies Equation (1):

$$n\lambda_g/2 < L < (n+0.2)\lambda_g/2, \quad \text{Equation (1)}$$

where $\lambda_g$ is a wavelength of the electromagnetic waves in the waveguide path of the resonator, and n is an integer.

3. The plasma processing apparatus of claim 1, wherein each of the first short-circuiting portion and the second short-circuiting portion is provided along the circumferential direction around the central axis, wherein the waveguide path of the resonator includes:

a lower portion disposed around the central axis and extending in a radial direction with respect to the central axis toward the second short-circuiting portion; and an upper portion disposed above the lower portion and around the central axis, and extending from the first short-circuiting portion in an opposite direction to the radial direction, and wherein the waveguide path of the resonator is disposed around the central axis, and extends alternately in the radial direction and the opposite direction in a meandering manner from the first short-circuiting portion to the second short-circuiting portion.

4. The plasma processing apparatus of claim 3, wherein the second short-circuiting portion is made of a dielectric material, and includes an annular plate interposed between an upper conductor wall and a lower conductor wall that constitute the lower portion, and wherein a thickness Hd of the annular plate is smaller than a length Hb of the lower portion of the waveguide path in a vertical direction along which the central axis extends.

5. The plasma processing apparatus of claim 4, wherein the waveguide path of the resonator includes an intermediate portion provided between the upper portion and the lower portion, and the length Hb of the lower portion in the vertical direction is larger than a length Hc of the intermediate portion in the vertical direction.

6. The plasma processing apparatus of claim 5, further comprising a connector configured to introduce the electromagnetic waves into the waveguide path of the resonator, wherein the connector is coupled to the upper portion.

7. The plasma processing apparatus of claim 6, wherein a length of the upper portion in the vertical direction along which the central axis extends is larger than the length of the lower portion and the length of the intermediate portion in the vertical direction.

8. The plasma processing apparatus of claim 6, wherein the connector is coupled to the upper portion at a location spaced apart from the central axis in the radial direction.

9. The plasma processing apparatus of claim 4, wherein the thickness Hd and the length Hb satisfy Equation (2):

$$\frac{H_b\sqrt{\varepsilon_r}}{H_d} > 9, \quad \text{Equation (2)}$$

where $\varepsilon_r$ is a relative dielectric constant of the dielectric material.

10. The plasma processing apparatus of claim 4, wherein the thickness Hd and the length Hb satisfy Equation (3):

$$\frac{H_b\sqrt{\varepsilon_r}}{H_d} > 19, \quad \text{Equation (3)}$$

where $\varepsilon_r$ is a relative dielectric constant of the dielectric material.

11. The plasma processing apparatus of claim 4, wherein a length in the radial direction of a region in the emitter exposed to the processing space is larger than the thickness Hd.

12. The plasma processing apparatus of claim 3, further comprising a connector configured to introduce the electromagnetic waves into the waveguide path of the resonator, wherein the connector is coupled to the upper portion.

13. The plasma processing apparatus of claim 1, further comprising a shower plate disposed below the upper electrode, wherein the emitter extends to surround the shower plate.

14. The plasma processing apparatus of claim 1, further comprising a radio-frequency power supply electrically coupled to the waveguide path of the resonator, and configured to generate radio-frequency power having a variable frequency and supply the electromagnetic waves into the waveguide path.

* * * * *